United States Patent [19]

Nordling et al.

[11] 4,410,964

[45] Oct. 18, 1983

[54] MEMORY DEVICE HAVING A PLURALITY OF OUTPUT PORTS

[76] Inventors: Karl I. Nordling, 9280 119th Ave., North, Largo, Fla. 33543; Scott Nance, 662 Lambeth Ct., Sunnyvale, Calif. 94087

[21] Appl. No.: 214,167

[22] Filed: Dec. 8, 1980

[51] Int. Cl.³ .............................................. G11C 7/00
[52] U.S. Cl. .................................... 365/189; 365/174; 365/220; 365/230
[58] Field of Search ............... 365/103, 104, 105, 174, 365/175, 189, 220, 219, 230

[56] References Cited

U.S. PATENT DOCUMENTS 4,150,364  4/1979  Baltzer .......................... 365/220 X

OTHER PUBLICATIONS

IBM Technical Discl. Bulletin, vol. 19, No. 7, pp. 2587-2589, Dec. 1976.

Primary Examiner—Robert L. Richardson
Attorney, Agent, or Firm—Alan H. MacPherson; Steven F. Caserza; Richard Franklin

[57] ABSTRACT

A memory device is constructed having a plurality of output ports, each output port being one word wide, such that a plurality of words may be accessed from the memory simultaneously.

13 Claims, 8 Drawing Figures

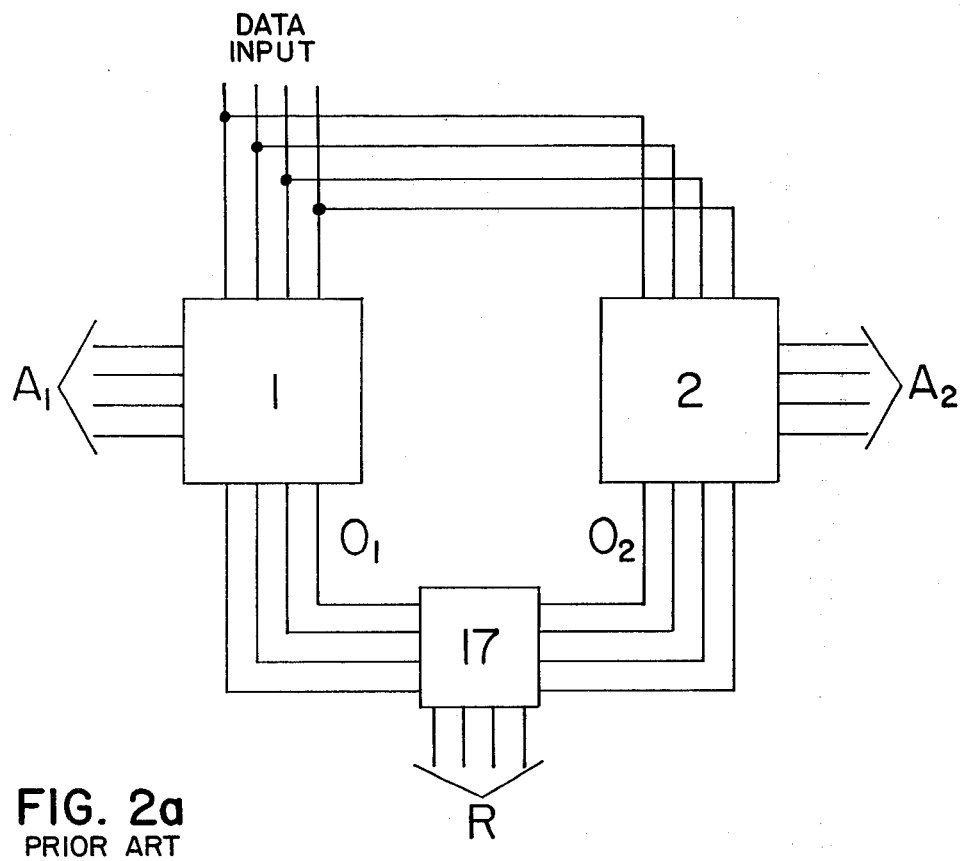
FIG. 2a
PRIOR ART
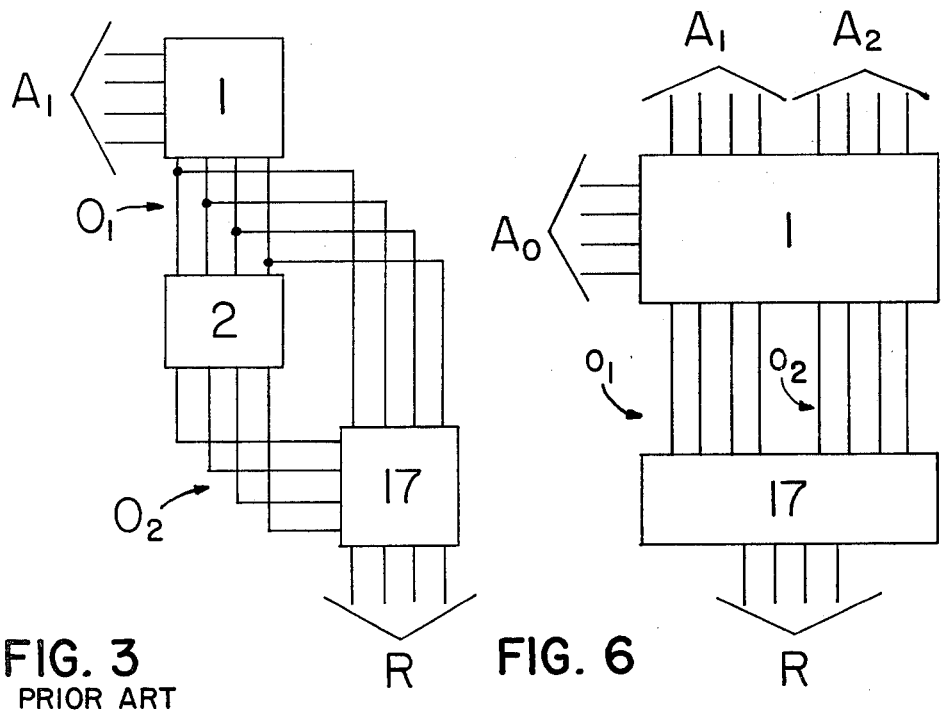
FIG. 3
PRIOR ART
FIG. 6

MEMORY DEVICE HAVING A PLURALITY OF OUTPUT PORTS

BACKGROUND OF THE INVENTION

1. Field of the Invention

This invention relates to electronic memory devices, and more specifically, to a semiconductor memory having a plurality of output ports such that a plurality of words stored in the memory may be accessed simultaneously.

2. Description of the Prior Art

Random access memories, or RAM's, are well known in the prior art. A block diagram of one such prior art RAM is shown in FIG. 1. Random access memory 400 of FIG. 1 contains memory cells 00 through 07 in row $R_0$, memory cells 10 through 17 in row $R_1$, and similar memory cells in rows $R_2$ through $R_{31}$, with memory cells on row $R_{31}$ being numbered 310 through 317. Each memory cell is capable of storing one binary digit ("bit") of information, as either a logical "1" ("high") or logical "0" ("low").

In the operation of the RAM 400 depicted in FIG. 1, the binary representation of the row which is to be accessed is comprised of five binary bits, there being 32 rows, $R_0$ through $R_{31}$. These five bits are carried to row decoder 401 through leads 402a-402e. Row decoder 401 then applies a logical high on the selected row, while maintaining logical lows on all remaining deselected rows. A logical low is also applied to terminal 600, which is connected to each column $C_0-C_7$ through buffer amplifiers $B_0-B_7$, respectively. Assuming row $R_0$ is selected by row decoder 401, row $R_0$ will be high and rows $R_1$ through $R_{31}$ will all be low. If memory cell 00 is programmed to contain a logical one, it will conduct, thus connecting column $C_0$ to row $R_0$. This causes row $R_0$ to pull column $C_0$ high. In a similar manner, if memory cell 01 is programmed to a logical zero, it will not conduct. Thus, column $C_1$ is not connected to row $R_0$, and column $C_1$ remains low. Thus, with row $R_0$ selected (high) and rows $R_1$ through $R_{31}$ deselected (low), the logical states on columns $C_0-C_7$ will be indicative of the logical states of the bits stored in memory cells 00-07, respectively.

Each row of RAM 400 contains two four-bit words. For example, row $R_0$ contains a first word consisting of bits 00 through 03, and a second word consisting of bits 04 through 07. The first columns from each word, $C_0$ and $C_4$, are connected to first word decoder 501 as shown. Similarly, the second columns from each word, $C_1$ and $C_5$, are connected to second word decoder 502. Similarly, $C_2$ and $C_6$ are connected to third word decoder 503 and $C_3$ and $C_7$ are connected to fourth word decoder 504. Word decoder input lead 512 is connected to each word decoder 501-504. By applying either a logical 0 or a logical 1 to word decoder input lead 512, either the first word of the selected row, as appears on columns $C_0-C_3$, or the second word of the selected row, as appears on column $C_4-C_7$, may be selected. The selected word appears at output port 525, consisting of output terminal 525a for the first bit, output terminal 525b for the second bit, output terminal 525c for the third bit and output terminal 525d for the fourth bit.

In many applications, a mathematical or logical operation is performed on two words, thus requiring access to both words simultaneously. One prior art method of doing this is simply to use two identical RAMs, as shown in FIG. 2a. The same information is stored in both RAMs by virtue of the fact that every word written into one RAM is also written into the other at the same location. When two words are to be accessed simultaneously and independently, one, say word A, is taken from RAM 1, and the second, word B, is taken from RAM 2. Such a technique requires two complete RAMs, each with its own address register, row decoder, and word or column decoders. With the binary representation of the address location of word A applied to address input port $A_1$ of RAM 1, word A appears at output port $O_1$ of RAM 1, and is applied to mathematical or logical operation circuit 17. Similarly, with the binary representation of the address location of word B applied to address input port $A_2$ of RAM 2, word B appears on output port $O_2$ of RAM 2, and is applied to mathematical or logical operation circuit 17. Circuit 17 is thus able to perform its operation on word A and word B, with the resultant appearing on output port R of circuit 17. Such a technique becomes rather expensive, and consumes a rather large amount of space when the RAMs used are of even moderate size, due to the complete duplication of base address registers, row decoders and word decoders required to operate both RAMs.

Another prior art method is to use two complete independent addressing systems within one RAM (e.g., the RAM contained in the AMD 2901, manufactured by Advanced Micro Devices). One way this can be implemented is shown in FIG. 2b. This is a 16 word by 4-bit RAM with 2 simultaneous independent outputs. Each bit position is provided with two 16 to 1 multiplexers; one controlled by the A-address lines (providing word A comprised of bits $A_0-A_3$) and the other by the B-address lines (providing word B comprised of bits $B_0-B_2$). Thus, two cells in each bit position can be simultaneously and independently specified and accessed. The disadvantage of this approach is the excessive amount of circuitry required for the addressing, hence it is limited to relatively small RAMs.

Another prior art method of obtaining access to two words simultaneously is to read a first word, store this first word in a buffer memory, and then access the first word stored in the buffer memory and a second word contained in the RAM, simultaneously. A block diagram showing a circuit using this prior art technique is shown in FIG. 3. A flow chart depicting the required steps for this type of operation is shown in FIG. 4. First it is required to apply to address input port $A_1$ of RAM 1 the binary representation of the address location required to access a first desired word, word "A". Word A is then stored in buffer memory 2 for later use. Next it is required to apply to address input port A of RAM 1 the binary representation of the address location required to access the second desired word, called word "B". The mathematical or logical operation may then be performed by operation circuit 17 on word A, as accessed from buffer memory 2 and available on output port $O_2$ of buffer memory 2, and word B, as accessed from RAM 1 and available on output port $O_1$ of RAM 1. The result from the mathematical or logical operation, available on output port R of operation circuit 17, may then be used or stored in a memory location reserved for the resultant. One disadvantage with this technique is that a separate buffer memory is required. Another, more serious disadvantage with this technique, is that the RAM must be accessed two separate times in order to have simultaneous access to word A and word B. The accessing of word and storage of word A in the buffer memory requires a finite amount of time, and in most applications these steps are repeated a large number of times, wherein the sum of the time delays created by accessing word A and word B individually becomes very large, thus drastically reducing the speed at which the system operates.

SUMMARY OF THE INVENTION

This invention utilizes a memory of a unique design to allow accessing of a plurality of words in the memory simultaneously without the drawbacks of the prior art methods cited above. One embodiment of the memory of this invention includes two sets of word decoders, thus allowing two words to be accessed simultaneously, with each accessed word being applied to one of two independent output ports.

BRIEF DESCRIPTION OF THE DRAWING

FIG. 2a is a block diagram of a prior art method of utilizing two RAMs to allow simultaneous access of two words.

FIG. 3 is a block diagram of another prior art method of obtaining simultaneous access to two words, originally contained in a single RAM, in order to perform a mathematical or logical operation on the two words.

FIG. 6 is a block diagram of a random access memory constructed in accordance with this invention connected to a circuit capable of performing mathematical or logical operations on the words received from each output of the memory of this invention.

DETAILED DESCRIPTION OF THE INVENTION

Figure 1:
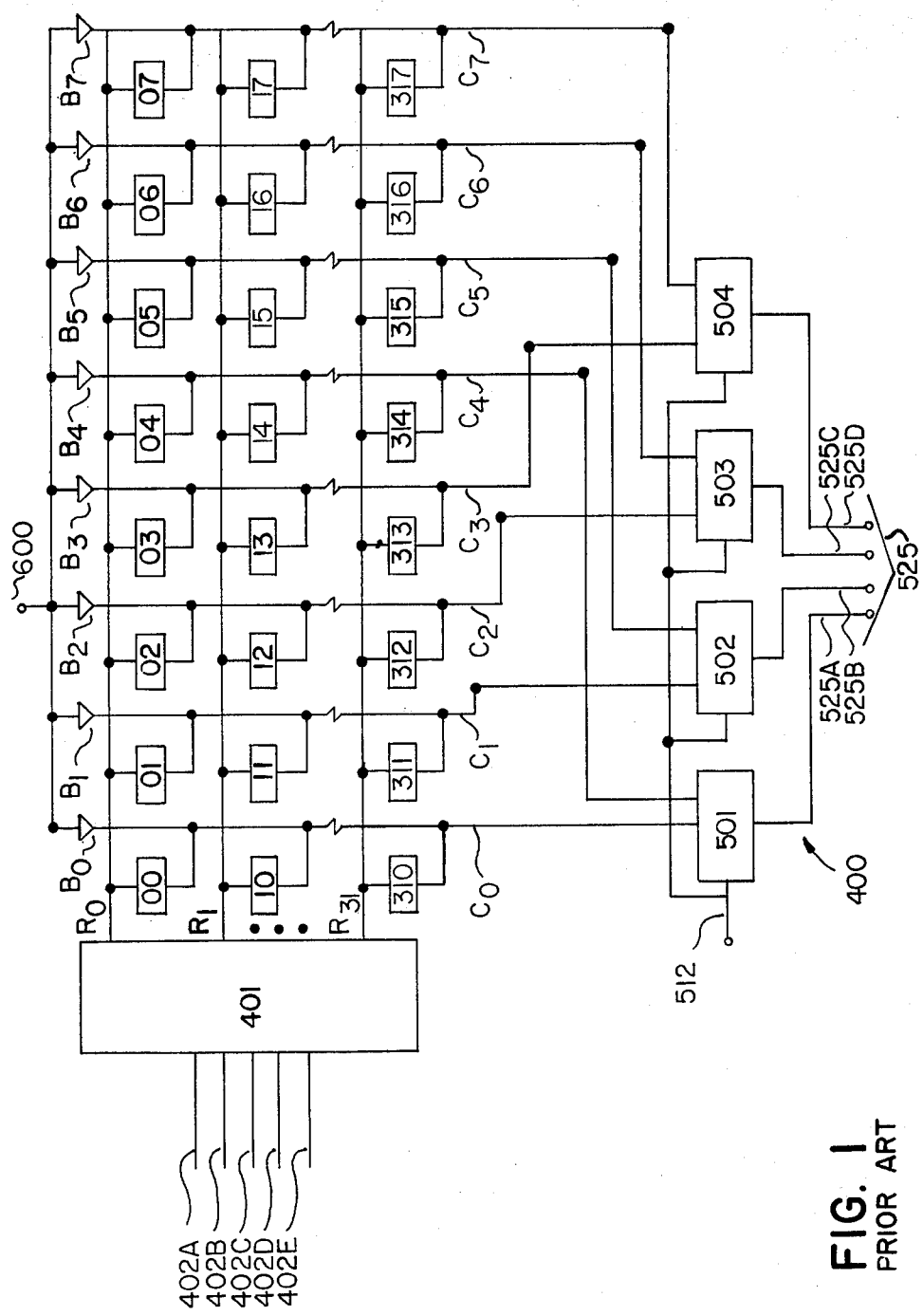
FIG. 1 is a block diagram of a typical prior art random access memory.
Figure 2B:
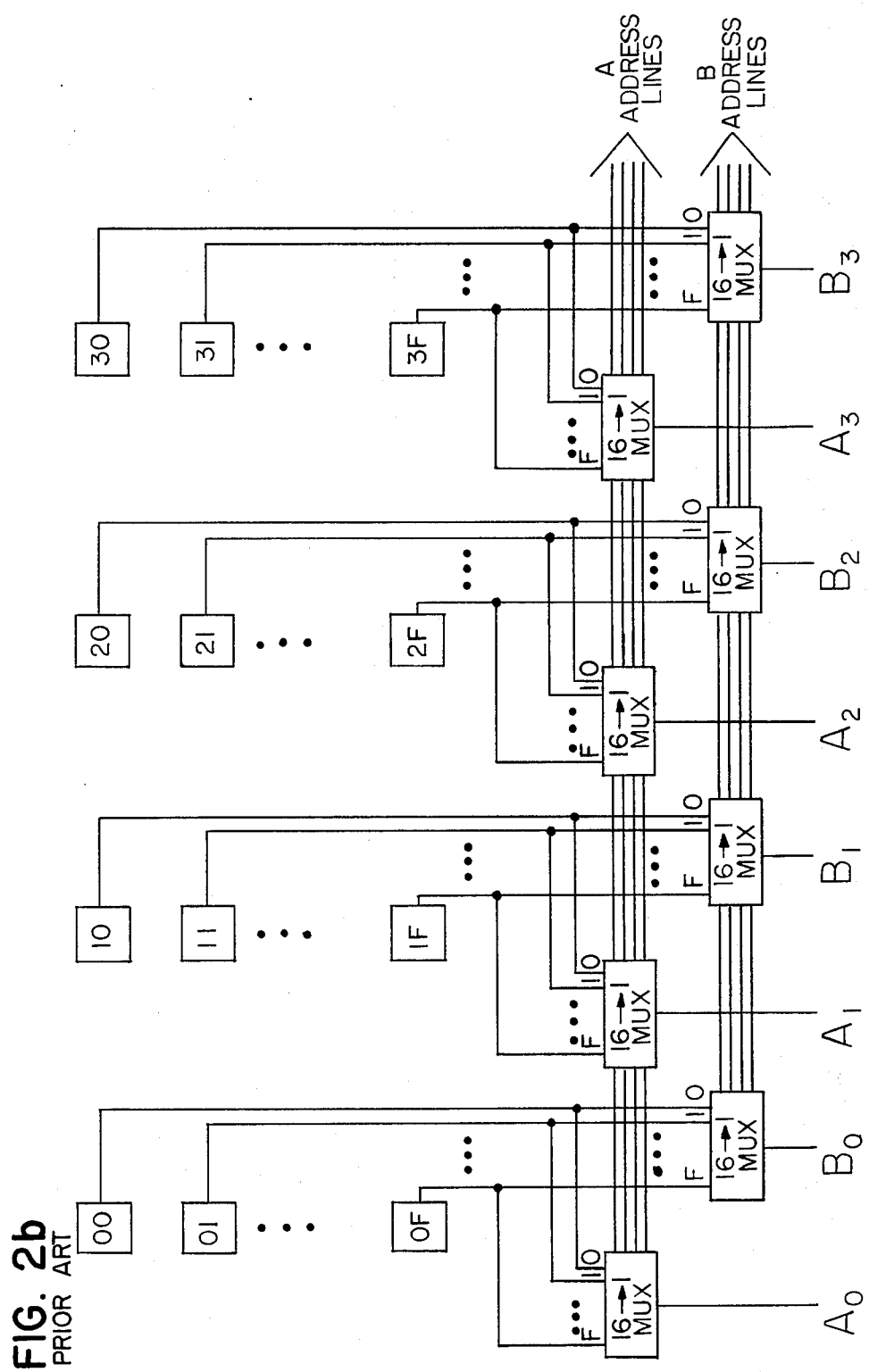
FIG. 2b is a block diagram of a prior art method utilizing a single RAM, which allows simultaneous access of two words.
Figure 5:
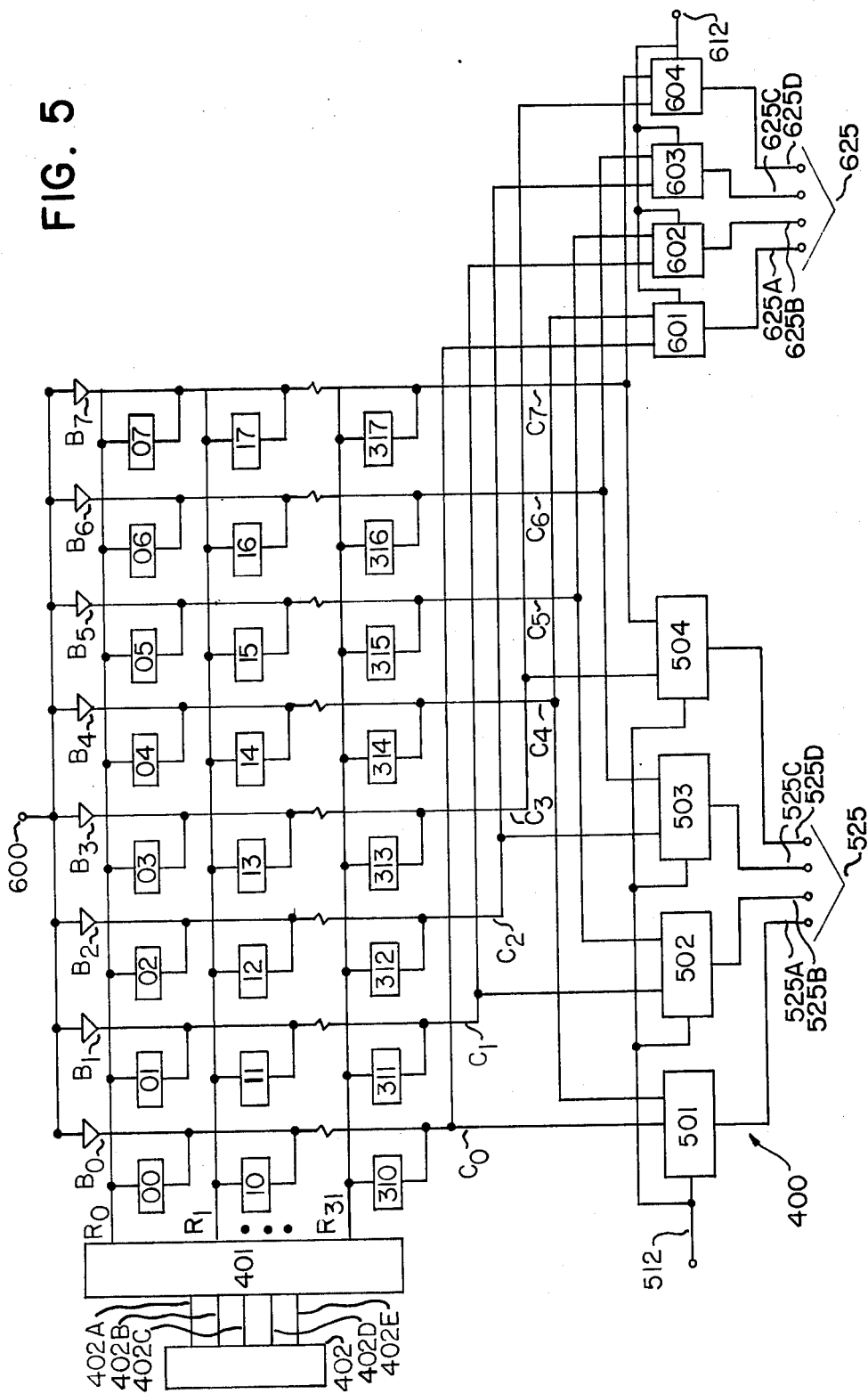
FIG. 5 is a block diagram of a random access memory constructed in accordance with this invention.

A block diagram of one embodiment of the random access memory of this invention is shown in FIG. 5. Similar to the prior art circuit of FIG. 1, the embodiment of this invention shown in FIG. 5 contains rows $R_0$-$R_{31}$, columns $C_0$-$C_7$, buffer amplifiers $B_0$-$B_7$, logical input terminal 600, and memory cells 00-317, formed at the intersection of each row and each column. The binary representation of the desired row is stored in base address register 402, and is fed to row decoder 401 through leads 402a-402e. A single row is selected, and a logical high is applied by row decoder 401 to the selected row. Row decoder 401 applies logical lows to all deselected rows. A logical low is placed on terminal 600 and is applied to columns $C_0$-$C_7$ through buffers $B_0$-$B_7$, respectively. If row $R_0$ is selected (high), column $C_0$ will remain low if the bit stored in memory cell 00 is a logical 0, thereby causing cell 00 to be nonconductive. On the other hand, column $C_0$ will be pulled high by row $R_0$ if the bit stored in cell 00 is a logical 1, thereby causing cell 00 to be conductive. Similarly, column $C_1$-$C_7$ will be indicative of the logical states of the bits stored in memory cells 01-07, respectively.

Each row contains two words of four bits each. The first word of row $R_0$ is comprised of bits 00, 01, 02, and 03. The second word of row $R_0$ is comprised of bits 04, 05, 06, and 07. The columns associated with the first bits of each of the top words ($C_0$ and $C_4$) are connected both to word decoder 501 and to word decoder 601. Similarly, columns $C_1$ and $C_5$ are connected to word decoders 502 and 602. Columns $C_2$ and $C_6$ are connected to word decoders 503 and 603, and columns $C_3$ and $C_7$ are connected to word decoders 504 and 604. Word A decoder input 512 is connected between word decoders 501, 502, 503 and 504. Based on the logical state applied to word A decoder input 512, word decoders 501 through 504 will apply either the first word contained in the selected row, or the second word contained in the selected row, to output port A 525 containing output leads 525a-525d. Simultaneously, depending on the logical state applied to word decoder input terminal 612, word decoders 601-604 will apply either the first word contained in the selected row, as appears on columns $C_0$ through $C_3$, or the second word contained in the selected row, contained on columns $C_4$ through $C_7$, to output port B 625, comprised of leads 625a-625d.

In this manner, two words contained in a single row of memory 400 may be accessed simultaneously, and available at output port A 525 and output port B 625. In actual practice, each row may be constructed to contain more than the eight bits shown in the circuit of FIG. 5, such that any desired number of words, each containing any desired number of bits, may be contained in each row. Similarly, the memory 400 may be constructed to contain any desired number of rows. Of course, larger memories containing a larger number of rows will require a similar increase in the size of base address register 402, row decoder 401 and leads connecting therebetween. Also, with larger memories, a greater number of columns may be present, as well as either increased word size, increased number of words in each row, or both. Thus, word decoders must be redesigned, utilizing the principals of this invention, to take into consideration the specific size and configuration of the memory.

In a similar fashion, memory circuits may be constructed in accordance with this invention utilizing more than two simultaneous output ports. For example, three, four, or any other desired number of output ports may be used, thereby allowing any number of words contained on a row to be accessed simultaneously. Of course, a complete word decoder will be needed for each output word, each word decoder being N bits wide, where N is the number of bits per word. However, only one row-decoder is needed.

FIG. 6 shows a less detailed block diagram of memory 1 constructed in accordance with this invention, connected with a mathematical or a logical operation circuit 17. Address input port $A_0$ of memory 1 contains all binary information needed to select the desired row contained in memory 1. Similarly, address port $A_1$ of memory 1 receives the desired binary representation of the address of the word contained in the selected row desired to be output to output port $0_1$ of memory 1. Likewise, address port $A_2$ of memory 1 receives the binary signal representative of the address of the word contained in the selected row desired to be made available on output port $0_2$ of memory 1. Word A, appearing on output port $O_1$, and word B, appearing on output port $O_2$, are applied to mathematical or logical operation circuit 17, with the resultant appearing on output port R.

Figure 4:
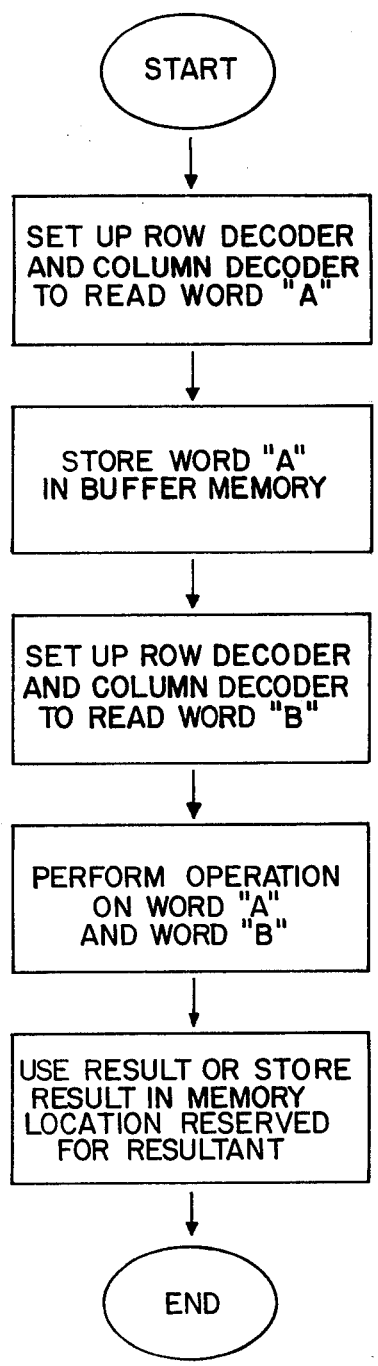
FIG. 4 is a flowchart depicting the steps required to perform a mathematical or logical operation on two words, utilizing the circuit of FIG. 3.
Figure 7:
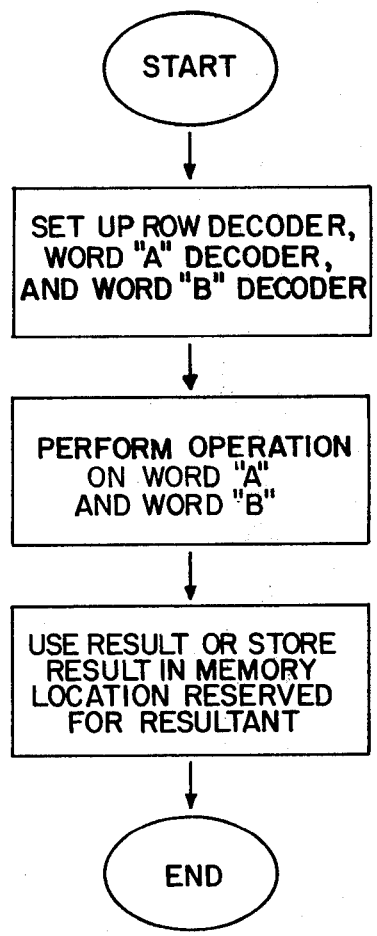
FIG. 7 is a flowchart depicting the steps required to perform mathematical or logical operations on two words simultaneously, utilizing the circuit FIG. 5.

A flow chart indicating the steps required to simultaneously access two words from a memory constructed in accordance with this invention is shown in FIG. 7. As indicated, the set up of the row decoder, the word A decoder and the word B decoder, all takes place in one step, simultaneously. This is in contrast to prior art methods of obtaining two words from a single memory, which, as shown in FIG. 4, requires two separate access operations. Referring again to FIG. 7, the next step is to perform the mathematical or logical operation on words A and B by operation circuit 17. The last step is to use or store or use the result from the mathematical or logical operation.

Thus, the invention overcomes the prior art weaknesses in methods used to retrieve several words of stored information from a memory for use in an operation which requires simultaneous access to more than one word. Memories constructed in accordance with this invention may be made smaller, and thus less expensively, than prior art methods which use two or more complete memories to perform this task, or one memory with two complete address systems. Similarly, memories constructed in accordance with this invention operate at a greater speed than prior art techniques utilizing a single memory wherein a first desired word is temporarily stored in a buffer memory, and a second desired word is obtained from the memory in a subsequent accessing operation, and eliminate the need for a buffer memory as required by prior art techniques utilizing a single memory.

The techniques of this invention are applicable to any type of memory system, including Random Access Memories (RAMs), and Read Only Memories (ROMs).

We claim:

1. A memory device comprised of:
a plurality of N rows, each said row comprising a conductive path;
a plurality of M columns, each said column comprising a conductive path;
a plurality of memory cells, each said cell being uniquely connected to one said row and one said column, thereby forming an array of NxM memory cells, each said memory cell capable of storing a single bit of binary data;
a plurality of r words contained on each said row, each said word comprising p bits, whereby each said row contains p.r bits;
means for selecting a single desired row of said plurality of rows while maintaining all other said rows of said plurality of rows deselected;
means for simultaneously selecting a plurality of desired words from said plurality of r words contained on said single desired row; and
means including a discrete decoder means for each of said plurality of desired words for applying each said selected word simultaneously to one of a plurality of output ports.

2. Structure as in claim 1 including means for applying a logical high to each said column, means for applying a logical low to said selected desired row, and means for applying a logical high to each said deselected row, wherein in said selected row each said memory cell containing a first of two binary logical states will conduct, thereby causing said selected row to pull each said column connected to each said memory cell containing said first logical state to a logical low, and wherein in each said selected row each memory cell containing a second of two binary logical states will not conduct, thereby causing each said column connected to each said memory cell containing said second logical state to remain high.

3. Structure as in claim 1 including means for applying a logical low to each said column, means for applying a logical high to said selected desired row, and means for applying a logical low to each said deselected row, wherein in said selected row each said memory cell containing a first of two binary logical states will conduct, thereby causing said selected row to pull each said column connected to each said memory cell containing said first logical state to a logical high, and wherein in each said selected row each memory cell containing a second of two binary logical states will not conduct, thereby causing each said column connected to each said memory cell containing said second logical state to remain low.

4. Structure as in claims 1, 2 or 3 wherein each said output port contains a plurality of p output terminals.

5. Structure as in claims 1, 2 or 3 wherein said plurality of desired words is 2.

6. Structure as in claims 1, 2, or 3 wherein said memory device is a Random Access Memory.

7. Structure as in claim 4 wherein said memory device is a Random Access Memory.

8. Structure as in claim 5 wherein said memory device is a Random Access Memory.

9. Structure as in claims 1, 2, or 3 wherein said memory device is a Read Only Memory.

10. Structure as in claim 4 wherein said memory device is a Read Only Memory.

11. Structure as in claim 5 wherein said memory device is a Read Only Memory.

12. Structure as in claims 1, 2, or 3 wherein said memory device is a monolithic semiconductor device.

13. Structure as in claim 1 in which said decoder means includes a decoder input of a logical state connected to a series of said descrete decoder means representing one of the selected words and a decoder input of a logical state connected to a series of said descrete decoder means representing another of one of the selected words, the logical state of each of said inputs determining which selected word will be applied to which series of decoder means and to which of the plurality of output ports.

* * * * *